United States Patent
Kobayashi et al.

(10) Patent No.: US 12,525,553 B2
(45) Date of Patent: Jan. 13, 2026

(54) TUNABLE INDUCTOR DEVICE

(71) Applicant: Qorvo US, Inc., Greensboro, NC (US)

(72) Inventors: Kevin Wesley Kobayashi, Redondo Beach, CA (US); Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 869 days.

(21) Appl. No.: 17/776,259

(22) PCT Filed: Nov. 24, 2020

(86) PCT No.: PCT/US2020/062013
§ 371 (c)(1),
(2) Date: May 12, 2022

(87) PCT Pub. No.: WO2021/108405
PCT Pub. Date: Jun. 3, 2021

(65) Prior Publication Data
US 2022/0415832 A1    Dec. 29, 2022

Related U.S. Application Data

(60) Provisional application No. 62/940,365, filed on Nov. 26, 2019.

(51) Int. Cl.
*H01L 23/66* (2006.01)
*H01F 17/00* (2006.01)
(Continued)

(52) U.S. Cl.
CPC ......... *H01L 23/66* (2013.01); *H01F 17/0006* (2013.01); *H10D 1/20* (2025.01);
(Continued)

(58) Field of Classification Search
CPC .. H10B 63/84; H01L 23/5283; H10N 70/011; H10N 70/826
See application file for complete search history.

(56) References Cited

U.S. PATENT DOCUMENTS 9,257,647 B2   2/2016  Borodulin et al.
9,368,720 B1   6/2016  Moon et al.
(Continued)

FOREIGN PATENT DOCUMENTS

CN    109599487 A    4/2019
DE    69631451 T2   12/2004

OTHER PUBLICATIONS

Office Action for German Patent Application No. 112020005771.2, mailed Jun. 30, 2024, 14 pages.
(Continued)

*Primary Examiner* — Marvin Payen
(74) *Attorney, Agent, or Firm* — Withrow & Terranova, P.L.L.C.

(57) ABSTRACT

Disclosed is a tunable inductor device having a substrate, a planar spiral conductor having a plurality of spaced-apart turns disposed over the substrate, and a phase change switch (PCS) having a patch of a phase change material (PCM) disposed over the substrate between and in contact with a pair of adjacent segments of the plurality of spaced-apart turns, wherein the patch of the PCM is electrically insulating in an amorphous state and electrically conductive in a crystalline state. The PCS further includes a thermal element disposed adjacent to the patch of PCM, wherein the thermal element is configured to maintain the patch of the PCM to within a first temperature range until the patch of the PCM converts to the amorphous state and maintain the patch of the PCM within a second temperature range until the first patch of PCM converts to the crystalline state.

20 Claims, 8 Drawing Sheets

(51) Int. Cl.
  *H10D 1/20* (2025.01)
  *H10N 70/00* (2023.01)
  *H10N 70/20* (2023.01)
(52) U.S. Cl.
  CPC ......... *H10N 70/231* (2023.02); *H10N 70/826* (2023.02); *H10N 70/861* (2023.02); *H10N 70/8828* (2023.02); *H10N 70/8833* (2023.02); *H01F 2017/0073* (2013.01); *H01L 2223/6672* (2013.01)

(56) References Cited

U.S. PATENT DOCUMENTS

| | | |
|---|---|---|
| 9,917,104 B1 | 3/2018 | Roizin et al. |
| 10,454,027 B1 | 10/2019 | Howard et al. |
| 10,461,253 B1 | 10/2019 | Slovin et al. |
| 10,475,993 B1 | 11/2019 | Slovin et al. |
| 10,476,001 B1 | 11/2019 | Rose et al. |
| 2001/0032999 A1 | 10/2001 | Yoshida |
| 2009/0201715 A1 | 8/2009 | Kreupl |
| 2011/0090038 A1 | 4/2011 | Perchlik |
| 2012/0083127 A1 | 4/2012 | Clark et al. |
| 2012/0091423 A1 | 4/2012 | Sumino |
| 2014/0042568 A1 | 2/2014 | Yamakawa |
| 2014/0166957 A1 | 6/2014 | Yang et al. |
| 2014/0191181 A1 | 7/2014 | Moon |
| 2014/0264230 A1 | 9/2014 | Borodulin et al. |
| 2016/0056373 A1 | 2/2016 | Goktepeli et al. |
| 2017/0256377 A1 | 9/2017 | Reig et al. |
| 2019/0105520 A1 | 4/2019 | Sverdlik et al. |
| 2019/0305043 A1 | 10/2019 | Carta et al. |
| 2020/0058851 A1 | 2/2020 | El-Hinnawy et al. |
| 2020/0133033 A1 | 4/2020 | Bhaskaran et al. |
| 2022/0392958 A1 | 12/2022 | Kobayashi et al. |

OTHER PUBLICATIONS

Author Unknown, "Phase-Change Materials and Switches for Enabling Beyond-CMOS Energy Efficient Applications," 2020, https://phasechange-switch.org/, 2 pages.
Bedair, S. et al., "High-Performance Micromachined Inductors Tunable by Lead Zirconate Titanate Actuators," IEEE Electron Device Letters, vol. 33, Issue 10, Aug. 2012, IEEE, pp. 1483-1485.
El-Nozahi, M. et al., "A CMOS Low-Noise Amplifier With Reconfigurable Input Matching Network," IEEE Transactions on Microwave Theory and Techniques, vol. 57, No. 5, Apr. 2009, IEEE, pp. 1054-1062.
Fu, C.-T. et al., "A 2.4-5.4-GHz Wide Tuning-Range CMOS Reconfigurable Low-Noise Amplifier," IEEE Transactions on Microwave Theory and Techniques, vol. 56, Issue 12, Nov. 2008, IEEE, pp. 2754-2763.
Kobayashi, K. et al., "A reconfigurable S-/X-band GaN cascode LNA MMIC," 2017 IEEE Compound Semiconductor Integrated Circuit Symposium (CSICS), Oct. 2017, IEEE, 4 pages.
Rais-Zadeh, M. et al., "MEMS Switched Tunable Inductors," Journal of Microelectromechanical Systems, vol. 17, Issue 1, Feb. 2008, IEEE, pp. 78-84.
Singh, R. et al., "A 3/5 GHz Reconfigurable CMOS Low-Noise Amplifier Integrated with a Four-Terminal Phase-Change RF Switch," 2015 IEEE International Electron Devices Meeting (IEDM), Dec. 7-9, 2015, Washington, DC, IEEE, 4 pages.
Singh, T. et al., "Characterization, Optimization, and Fabrication of Phase Change Material Germanium Telluride Based Miniatured DC-67 GHz RF Switches," IEEE Transactions on Microwave Theory and Techniques, vol. 67, Issue 8, Aug. 2019, IEEE, 14 pages.
Wainstein, N. et al., "Radiofrequency Switches Based on Emerging Resistive Memory Technologies—A Survey," Proceedings of the IEEE, vol. 109, No. 1, Aug. 2020, IEEE, pp. 77-95.
Wang, F. et al., "An Artificial-Intelligence (AI) Assisted Mm-Wave Multi-Band Doherty Transmitter," 2019 IEEE MTT-S International Microwave Conference on Hardware and Systems for 5G and Beyond (IMC-5G), Aug. 2019, pp. 487-490.
Wang, F. et al., "4.8 A Highly Linear Super-Resolution Mixed-Signal Doherty Power Amplifier for High-Efficiency mm-Wave 5G Multi-GB/s Communications," 2019 IEEE International Solid-State Circuits Conference—(ISSCC), Feb. 2019, San Francisco, CA, USA, IEEE, 3 pages.
Wang, S. et al., "Tunable Inductors Using Vanadium Dioxide as the Control Material," Microwave and Optical Technology Letters, vol. 59, No. 5, May 2017, pp. 1057-1061.
Wen, C.Y. et al., "A Phase-change via-Reconfigurable On-Chip Inductor," 2010 IEEE International Electron Devices Meeting (IEDM 2020), Dec. 6-8, 2010, San Francisco, CA, IEEE, 4 pages.
Yoo, S.-S. et al., "A Compact Reconfigurable LNA for Single Path Multistandard Receiver," 2007 IEEE Conference on Electron Devices and Solid-State Circuits, Dec. 20-22, 2007, Tainan, Taiwan, IEEE, 4 pages.
Zine-El-Abidine, I. et al., "A Tunable RF MEMS Inductor," 2004 International Conference on MEMS, NANO and Smart Systems (ICMENS'04), Aug. 25-27, 2004, Banff, AB, Canada, IEEE, 3 pages.
Vinodhini, G. et al., "Reconfigurable LNA for MB-OFDM Receiver using Active Inductor," International Journal of Computer Applications, vol. 89, No. 18, Mar. 2014, 7 pages.
International Search Report and Written Opinion for International Patent Application No. PCT/US2020/060621, mailed Feb. 26, 2021, 15 pages.
International Search Report and Written Opinion for International Patent Application No. PCT/US2020/062013, mailed Mar. 31, 2021, 15 pages.
Notice of Allowance for Chinese Patent Application No. 202080080600. 7, mailed Aug. 25, 2025, 8 pages.

TUNABLE INDUCTOR DEVICE

RELATED APPLICATIONS

This application is a 35 USC 371 national phase filing of International Application No. PCT/US2020/062013, filed Nov. 24, 2020, which application claims the benefit of U.S. provisional patent application Ser. No. 62/940,365, filed Nov. 26, 2019, the disclosures of which are hereby incorporated herein by reference in their entireties.

FIELD OF THE DISCLOSURE

The present disclosure relates to tunable inductors having switched windings.

BACKGROUND

A practical tunable integrated circuit (IC) inductor element remains a coveted missing component in IC design even though practical switch capacitor arrays and high quality factor (Q) varactors exist in mainstream semiconductor IC technologies. Active IC inductors have had restricted applications due to non-linearity, noise, and power dissipation constraints. While switched turn planar spiral inductors integrated in silicon semiconductor have been implemented in monolithic amplifiers, they have resulted in modest quality factors, low frequency of operation, and large implementation size. To date, low-noise amplifiers (LNAs) employing switched turn planar spiral inductors have resulted in very modest and unremarkable noise figure performance compared with fixed inductor matched LNAs. These less-than-practical results are attributed to a combination of the modest switch field-effect transistor (FET) figure-of-merit active transistor performance and significant substrate and interconnect losses. Coarsely switched inductor banks have been implemented in gallium nitride high electron mobility (HEMT) technology, resulting in better amplifier performance due to the use of superior HEMT FET device and lower silicon carbide substrate and gold metal interconnect losses. However, the switched bank inductor implementation is large and ultimately limited by the GaN switch figure of merit which is 1 order of magnitude shy of microelectromechanical systems—based tunable inductor devices. As such, traditional switched bank inductor implementations for tuning inductance in a monolithic microwave integrated circuit remains elusive. Thus, there remains a need for a tunable inductor device that provides high performance in a monolithic microwave integrated circuit.

SUMMARY

Disclosed is a tunable inductor device having a substrate, a planar spiral conductor having a plurality of spaced-apart turns disposed over the substrate, and a phase change switch (PCS) having a patch of a phase change material (PCM) disposed over the substrate between and in contact with a pair of adjacent segments of the plurality of spaced-apart turns, wherein the patch of the PCM is electrically insulating in an amorphous state and electrically conductive in a crystalline state. The PCS further includes a thermal element disposed adjacent to the patch of PCM, wherein the thermal element is configured to maintain the patch of the PCM to within a first temperature range until the patch of the PCM converts to the amorphous state and maintain the patch of the PCM within a second temperature range until the patch of PCM converts to the crystalline state.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
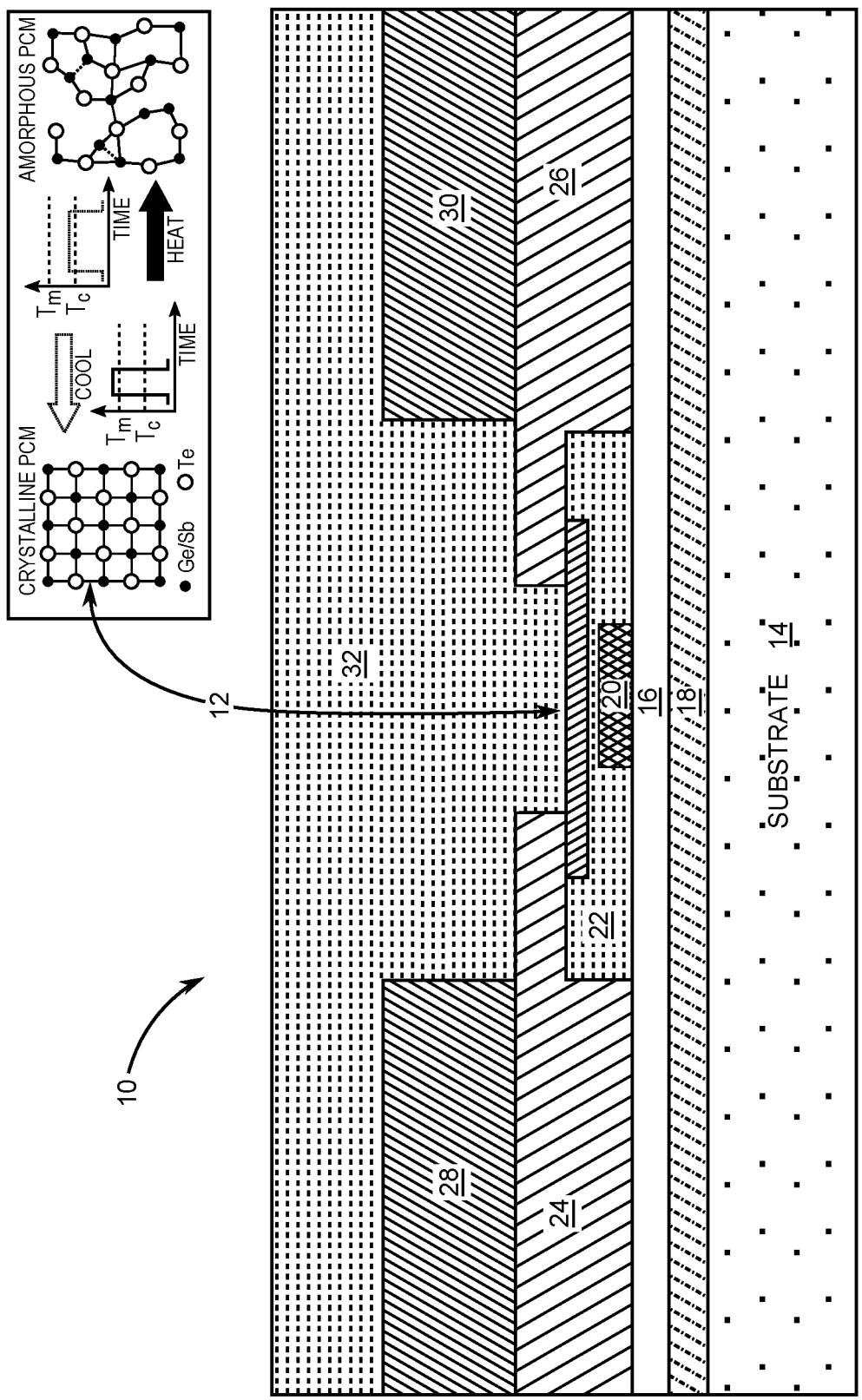
FIG. 1 is a cross-sectional view of a first exemplary embodiment of a phase change switch (PCS) that in accordance with the present disclosure is fabricated from a phase change material (PCM).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a cross-sectional view of a first exemplary embodiment of a phase change switch (PCS) 10 that in accordance with the present disclosure is fabricated from a phase change material (PCM) 12, such as chalcogenide phase change materials, which include but are not limited to vanadium dioxide ($VO_2$), germanium telluride (GeTe), and germanium-antimony-telluride (GST). The PCS 10 includes a substrate 14 made of semiconductor material such as silicon or silicon carbide.

A thermal insulator layer 16 is disposed over the substrate 14. The thermal insulator layer 16 has a thermal conductance that is between 0.1 watt per meter-kelvin and 0.4 watt per meter-kelvin. The thermal insulator layer 16 may be made of silicon dioxide, and a suspension layer 18 may optionally be sandwiched between the substrate 14 and the thermal insulator layer 16. The suspension layer 18 may be particularly useful in embodiments in which the thermal insulation layer 16 includes one or more air chambers for additional thermal insulation and/or lower dielectric constant. The suspension layer 18 may be made of a semiconductor material such as a nitride compound.

A thermal element 20 is disposed over both the substrate 14 and the thermal insulator layer 16. The thermal element 20 may be made of a thermoelectric semiconductor material or an ohmic material such as is used to fabricate resistors. Such materials include but are not limited to metals and carbon compounds.

A first dielectric layer 22 is disposed over both the thermal insulator layer 16 and the thermal element 20. The first dielectric layer 22 typically has a thermal conductance of at least 30 watts per meter-kelvin. In this exemplary embodiment, the first dielectric layer 22 is made of silicon nitride.

A patch of the PCM 12 is disposed over the thermal element 20, and in this exemplary embodiment, the patch of the PCM 12 is disposed over the thermal element 20 with tens of nanometers to hundreds of nanometers separating the patch of the PCM 12 from the thermal element 20. In some embodiments, the patch of the PCM 12 may reside directly onto the thermal element 20.

A first metal layer section 24 is disposed over the substrate 14 in electrical contact a leftmost portion of the patch of the PCM 12. A second metal layer section 26 is disposed over the substrate 14 in electrical contact with a rightmost portion of the patch of the PCM 12 and is separated from the first metal layer section 24 by a gap over the patch of the PCM 12. In this exemplary embodiment the gap is between 1 micrometer and 7 micrometers. In some embodiments the gap is between 1 micrometer and 4 micrometers. In other embodiments the gap is between 4 micrometers and 7 micrometers.

A first external electrical contact 28 is disposed over the first metal layer section 24 and is electrically conductive with the first metal layer section 24. A second external electrical contact 30 is disposed over the second metal layer section 26 and is electrically conductive with the second metal layer section 26. A second dielectric layer 32 is disposed within the gap over the patch of the PCM 12. The second dielectric layer 32 electrically isolates the first external electrical contact 28 from the second external electrical contact 30. As depicted in this exemplary embodiment, the second dielectric layer 32 may also extend over the first external electrical contact 28 and the second external electrical contact 30.

In operation of the PCS 10, to place the PCS 10 into the off-state an electrical current in a first current range is driven through the thermal element 20 to raise the temperature of the patch of PCM 12 from a crystallization temperature $T_c$ to a melt temperature $T_m$ for a duration of on the order of 100 nanoseconds. In this case, the melt temperature $T_m$ causes the patch of PCM 12 to transition from crystalline to amorphous. In contrast, to place the PCS 10 into the on-state an electrical current in a second current range is driven through the thermal element 20 to maintain the temperature of the patch of PCM 12 at the crystallization temperature $T_c$ for a duration of on the order of 1 microsecond. In this case, the crystallization temperature $T_c$ causes the patch of PCM 12 to transition from amorphous to crystalline. The crystallization temperature $T_c$ and the melt temperature $T_m$ depend upon the type of PCM. In some embodiments a range for the crystallization temperature $T_c$ is between 100° C. and 300° C., and a range for the melt temperature $T_m$ is between 500° C. and 800° C. In some embodiments, the first current range is between 200 milliamperes and 500 milliamperes and the second current range is between 700 milliamperes and 1000 milliamperes.

Figure 2:
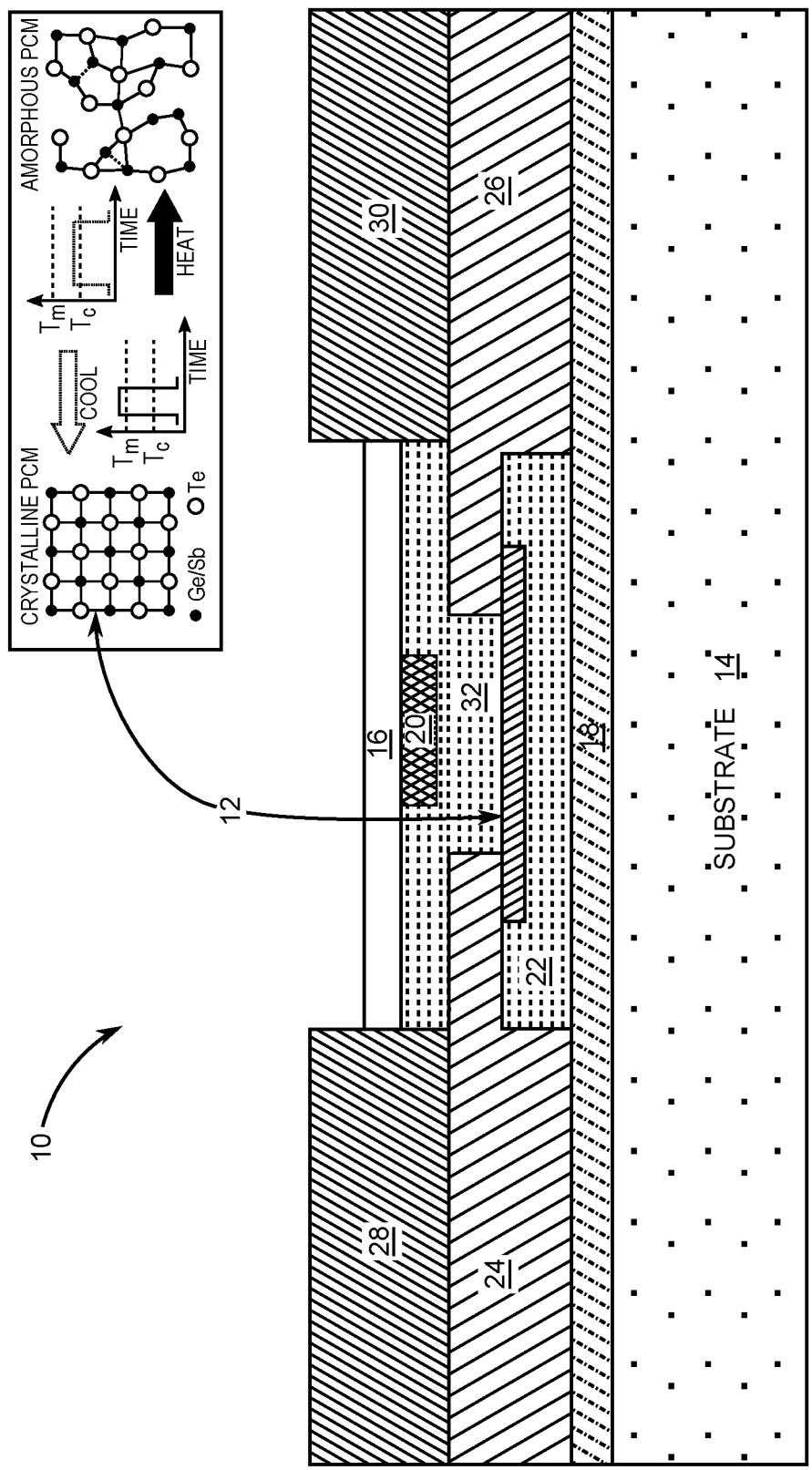
FIG. 2 is a cross-sectional view of a second embodiment of the PCS that in accordance with the present disclosure is based on the PCM.

FIG. 2 is a cross-sectional view of a second embodiment of the PCS 10 that in accordance with the present disclosure is based on the PCM 12. In this exemplary embodiment, the first patch of the PCM 12 is sandwiched between the thermal element 20 and the substrate 14, and the thermal insulator layer 16 is disposed over the thermal element 20. In this second embodiment, the optional suspension layer 18 may be made of a semiconductor material such as a nitride compound. The operation of this second embodiment of the PCS 10 is substantially identical to the operation of the first embodiment of the PCS 10 depicted in FIG. 1.

Figure 3:
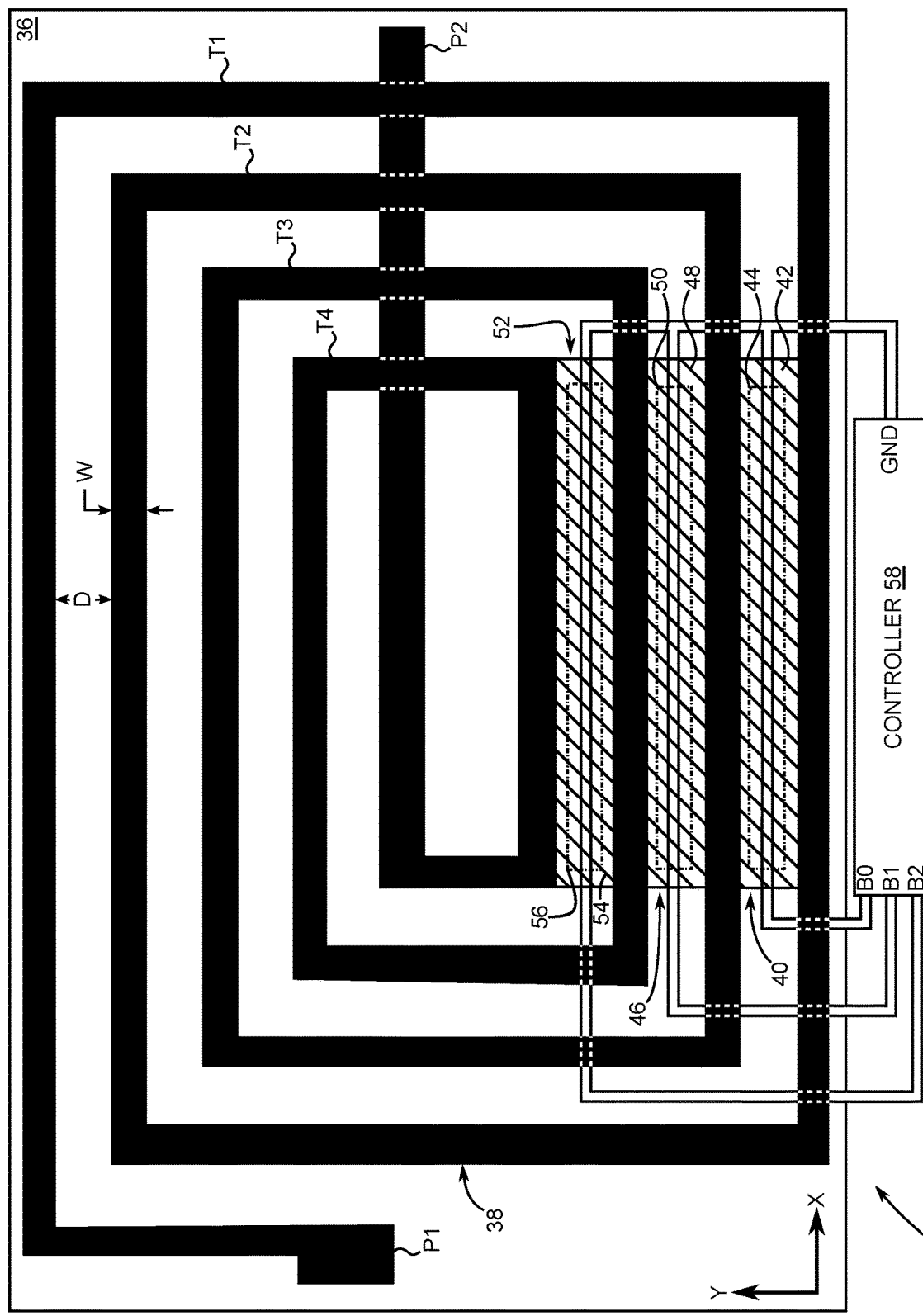
FIG. 3 is a plan view of a first embodiment of a tunable inductor device having a substrate with a planar spiral conductor having a plurality of spaced-apart turns disposed over the substrate.

FIG. 3 is a plan view of a tunable inductor device 34 having a substrate 36 with a planar spiral conductor 38 having a plurality of spaced-apart turns T1, T2, T3, and T4 disposed over the substrate 36. The plurality of spaced-apart turns T1, T2, T3, and T4 are laterally spaced by a distance D. In some embodiments, the distance D is between 10 micrometers and 50 micrometers. In other embodiments, the distance D is between 50 micrometers and 100 micrometers. In yet other embodiments, the distance D is between 100 micrometers and 500 micrometers. In yet another embodiment, the distance D is between 1 micrometer and 5 micrometers. A width W of the planar spiral conductor 38 may be equal to the distance D. Moreover, it is to be understood that the distance D and the width W do not need to be uniform throughout the planar spiral conductor 38. The planar spiral inductor 38 has a first port P1 at one end and a second port P2 at another end. The first port P1 and the second port P2 are configured to receive and output a signal such as a radio frequency signal. In at least some embodiments the substrate 36 comprises a monolithic microwave integrated circuit into which the planar spiral conductor 38 is integrated.

In exemplary embodiments, the planar spiral conductor 38 is a rectangular spiral wherein each of the plurality of spaced turns T1, T2, T3, and T4 has two segments that are aligned with an X-direction and two segments that are aligned with a Y-direction. The segments that are aligned with the X-direction are orthogonal to within ±5 degrees of the segments that are aligned with the Y-direction. It is to be noted that the plurality of spaced turns T1, T2, T3, and T4 may have more or fewer spaced turns than the four spaced turns depicted in FIG. 1. For example, in some embodiments, the number of spaced turns may be tens of spaced turns. In other embodiments, the number of spaced turns may be hundreds of spaced turns.

In this first embodiment, the tunable inductor device 34 includes a first phase change switch (PCS) 40. The first PCS 40 may have either the same structure of the first embodiment of the PCS 10 depicted in FIG. 1 or the same structure of the second embodiment of the PCS 10 depicted in FIG. 2. As depicted in FIG. 3, the first PCS 40 includes a first patch of a phase change material (PCM) 42 disposed over the substrate 36 between and in contact with adjacent segments of a first pair of spaced-apart turns T1 and T2. The first patch of the PCM 42 is electrically insulating in an amorphous state and electrically conductive in a crystalline state. A first thermal element 44 is disposed adjacent to the first patch of the PCM 42. The first thermal element 44 is configured to maintain the first patch of the PCM 42 to within a first temperature range until the first patch of the PCM 42 converts to the amorphous state when electrical current within a first current range is flowing through the first thermal element 44 and maintain the first patch of the PCM 42 within a second temperature range until the first patch of the PCM 42 converts to the crystalline state when electrical current is flowing through the first thermal element 44 within a second current range.

In this first embodiment, the tunable inductor device 34 also includes a second PCS 46. The second PCS 46 may have the same structure of either the first embodiment of the PCS 10 depicted in FIG. 1 or the same structure of the second embodiment of the PCS 10 depicted in FIG. 2. As depicted in FIG. 3, the second PCS 46 includes a second patch of the PCM 48 disposed over the substrate 36 between and in contact with adjacent segments of a second pair of spaced-apart turns T2 and T3. The second patch of the PCM 48 is electrically insulating in an amorphous state and electrically conductive in a crystalline state. A second thermal element 50 is disposed adjacent to the second patch of the PCM 48. The second thermal element 50 is configured to maintain the second patch of the PCM 48 to within the first temperature range until the second patch of the PCM 48 converts to the amorphous state when electrical current within the first current range is flowing through the second thermal element 50 and maintain the second patch of the PCM 48 within the second temperature range until the second patch of the PCM 48 converts to the crystalline state when electrical current is flowing through the second thermal element 50 within the second current range.

Moreover, in this first embodiment, the tunable inductor device 34 further includes a third PCS 52. The third PCS 52 may have the same structure of either the first embodiment of the PCS 10 depicted in FIG. 1 or the same structure of the second embodiment of the PCS 10 depicted in FIG. 2. As depicted in FIG. 3, the third PCS 52 includes a third patch of the PCM 54 disposed over the substrate 36 between and in contact with adjacent segments of a third pair of spaced-apart turns T3 and T4. The third patch of the PCM 54 is electrically insulating in an amorphous state and electrically conductive in a crystalline state. A third thermal element 56 is disposed adjacent to the third patch of the PCM 54. The third thermal element 56 is configured to maintain the third patch of the PCM 54 to within the first temperature range until the third patch of the PCM 54 converts to the amorphous state when electrical current within the first current range is flowing through the third thermal element 56 and maintain the third patch of the PCM 54 within the second temperature range until the third patch of the PCM 54 converts to the crystalline state when electrical current is flowing through the third thermal element 56 within the second current range.

The first thermal element 44, the second thermal element 50, and the third thermal element 56 are configured to couple to outputs B0, B1, and B2 of a controller 58. In operation, electrical current flows through each of the first thermal element 44, the second thermal element 50, and the third thermal element 56 within the first current range for a first duration when the controller 58 generates a first output voltage range at the outputs B0, B1, and B2 for the first duration. In contrast, electrical current flows through each of the first thermal element 44, the second thermal element 50, and the third thermal element 56 within the second current range for a second duration when the controller 58 generates a second output voltage range at the outputs B0, B1, and B2 for the second duration. In both cases, the electrical current flowing from the outputs B0, B1, and B2 returns to the controller 58 by way of a ground connection GND.

During operation, inductance of the tunable inductor device 34 is reduced by selectively shorting adjacent segments of the plurality of spaced turns T1, T2, T3, and T4 of the planar spiral conductor 38. In order to reduce the inductance of the tunable inductor device 34 by a first amount, the controller 58 drives the first thermal element 44 with an electrical current at the second current level for the second duration to maintain the first patch of the PCM 42 within the second temperature range until the first patch of the PCM 42 converts to the crystalline state. In the crystalline state, the first patch of the PCM 42 is electrically conductive such that the segments of turn T1 and turn T2 contacted by the first patch of PCM 42 are shorted together, which reduces the inductance of tunable inductor device 38. In order to further reduce the inductance of the tunable inductor device 34 by a second amount, the controller 58 drives the second thermal element 50 with an electrical current at the second current level for the second duration to maintain the second patch of the PCM 48 within the second temperature range until the second patch of the PCM 48 converts to the crystalline state. In the crystalline state, the second patch of the PCM 48 is electrically conductive such that the segments of turn T2 and turn T3 contacted by the second patch of PCM 48 are shorted together, which further reduces the inductance of tunable inductor device 38. In order to further reduce the inductance of the tunable inductor device 34 by a third amount, the controller 58 drives the third thermal element 56 with an electrical current at the second current level for the second duration to maintain the third patch of the PCM 54 within the second temperature range until the third patch of the PCM 54 converts to the crystalline state. In the crystalline state, the third patch of the PCM 54 is electrically conductive such that the segments of turn T3 and turn T4 contacted by the third patch of PCM 54 are shorted together, which yet further reduces the inductance of tunable inductor device 38. It is to be understood that permutations of inductance tuning are available by permutations of logic state of the outputs B0, B1, and B2.

During further operation, inductance of the tunable inductor device 34 is increased by selectively opening shorts between adjacent segments of the plurality of spaced turns T1, T2, T3, and T4 of the planar spiral conductor 38. In order to increase the inductance of the tunable inductor device 34 by a first amount, the controller 58 drives the first thermal element 44 with an electrical current at the first current level for the first duration to maintain the first patch of the PCM 42 within the first temperature range until the first patch of the PCM 42 converts to the amorphous state. In the amorphous state, the first patch of the PCM 42 is electrically non-conductive such that the segments of turn T1 and turn T2 contacted by the first patch of PCM 42 are electrically opened from each other, which increases the inductance of tunable inductor device 38. In order to further increase the inductance of the tunable inductor device 34 by a second amount, the controller 58 drives the second thermal element 50 with an electrical current at the first current level for the first duration to maintain the second patch of the PCM 48 within the first temperature range until the second patch of the PCM 48 converts to the amorphous state. In the amorphous state, the second patch of the PCM 48 is electrically non-conductive such that the segments of turn T2 and turn T3 contacted by the second patch of PCM 48 are electrically opened from each other, which further increases the inductance of tunable inductor device 38. In order to further increase the inductance of the tunable inductor device 34 by a third amount, the controller 58 drives the third thermal element 56 with an electrical current at the first current level for the first duration to maintain the third patch of the PCM 54 within the first temperature range until the third patch of the PCM 54 converts to the amorphous state. In the amorphous state, the third patch of the PCM 54 is electrically non-conductive such that the segments of turn T3 and turn T4 contacted by the third patch of PCM 54 are electrically opened from each other, which yet further increases the inductance of tunable inductor device 38.

Figure 4:
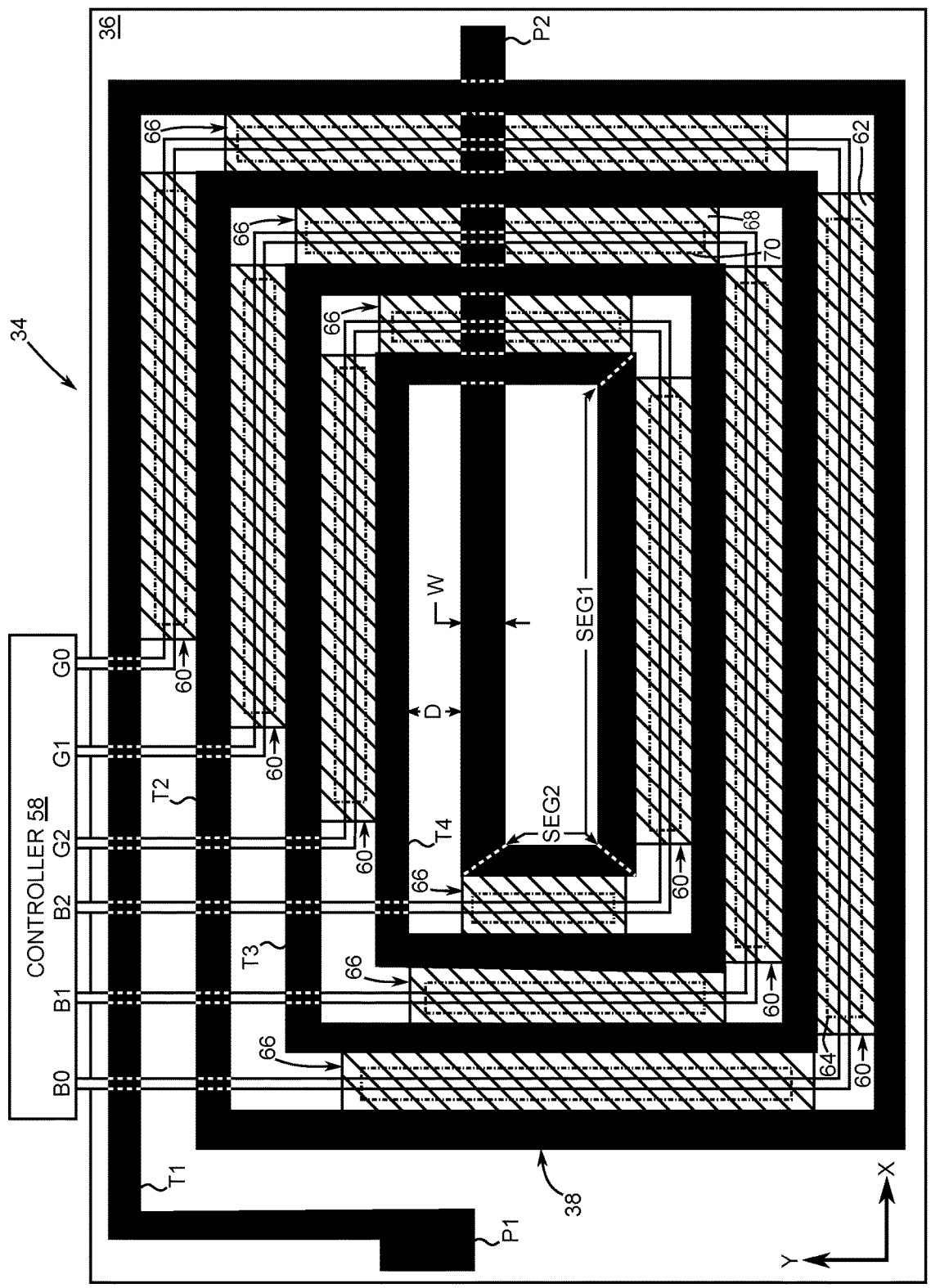
FIG. 4 is a plan view of a second embodiment of the tunable inductor device having a reduced on-state resistive loss.

FIG. 4 is a plan view of a second embodiment of the tunable inductor device 34 having a reduced on-state resistive loss. In this embodiment, each of the plurality of spaced-apart turns T1, T2, T3, and T4 has first segments such as SEG1 that are longitudinally aligned in a first direction and second segments such as SEG2 that are longitudinally aligned in a second direction that is different from the first direction. In FIG. 4, the first direction is the X-direction and the second direction is the Y-direction. This embodiment includes a plurality of first segment PCSs 60 that each have a first patch of a phase change material (PCM) 62 disposed over the substrate 36 between and in contact with a pair of adjacent first segments such as the first segments of spaced-apart turns T1 and T2, wherein the first patch of the PCM 62 is electrically insulating in an amorphous state and electrically conductive in a crystalline state. Each of the plurality of PCSs 60 has a first thermal element 64 disposed adjacent to the first patch of the PCM 62. Each first thermal element 64 is configured to maintain each first patch of the PCM 64 to within a first temperature range until each first patch of the PCM 62 converts to the amorphous state when electrical current within a first current range is flowing through each first thermal element 64 and maintain each first patch of the PCM 62 within a second temperature range until each first patch of the PCM 62 converts to the crystalline state when electrical current is flowing through each first thermal element 64 within a second current range.

The second embodiment of the tunable inductor device 34 further includes a plurality of second segment PCSs 66 that each have a second patch of PCM 68 disposed over the substrate 36 between and in contact with a pair of adjacent second segments such as the second segments of spaced-apart turns T1 and T2, wherein the second patch of the PCM 68 is electrically insulating in an amorphous state and electrically conductive in a crystalline state. Each of the plurality of second segment PCSs 66 has a second thermal element 70 disposed adjacent to the second patch of the PCM 68. Each second thermal element 70 is configured to maintain each second patch of the PCM 68 to within the first temperature range until the second patch of the PCM 68 converts to the amorphous state when electrical current within the first current range is flowing through each second thermal element 70 and maintain each second patch of the PCM 68 within the second temperature range until each second patch of the PCM 68 converts to the crystalline state when electrical current is flowing through each second thermal element 70 within the second current range. Electrical current flowing from the outputs B0, B1, and B2 returns to the controller 58 by way of ground connections G0, G1, and G2, respectively.

In some embodiments, individual lengths of the plurality of first segment PCSs 60 are between 30% and 50% of the length of the shortest one of the adjacent segments that each individual PCS of the plurality of first segment PCSs 60 is disposed between. In other embodiments, individual lengths of the plurality of first segment PCSs 60 are between 50% and 100% of the length of the shortest one of the adjacent segments that each individual PCS of the plurality of first segment PCSs 60 is disposed between. Similarly, individual lengths of the plurality of second segment PCSs 66 are between 30% and 50% of the length of the shortest one of the adjacent segments that each individual PCS of the plurality of second segment PCSs 66 is disposed between. In other embodiments, individual lengths of the plurality of second segment PCSs 66 are between 50% and 100% of the length of the shortest one of the adjacent second segments that each individual PCS of the plurality of second segments PCSs 66 is disposed between.

Figure 5:
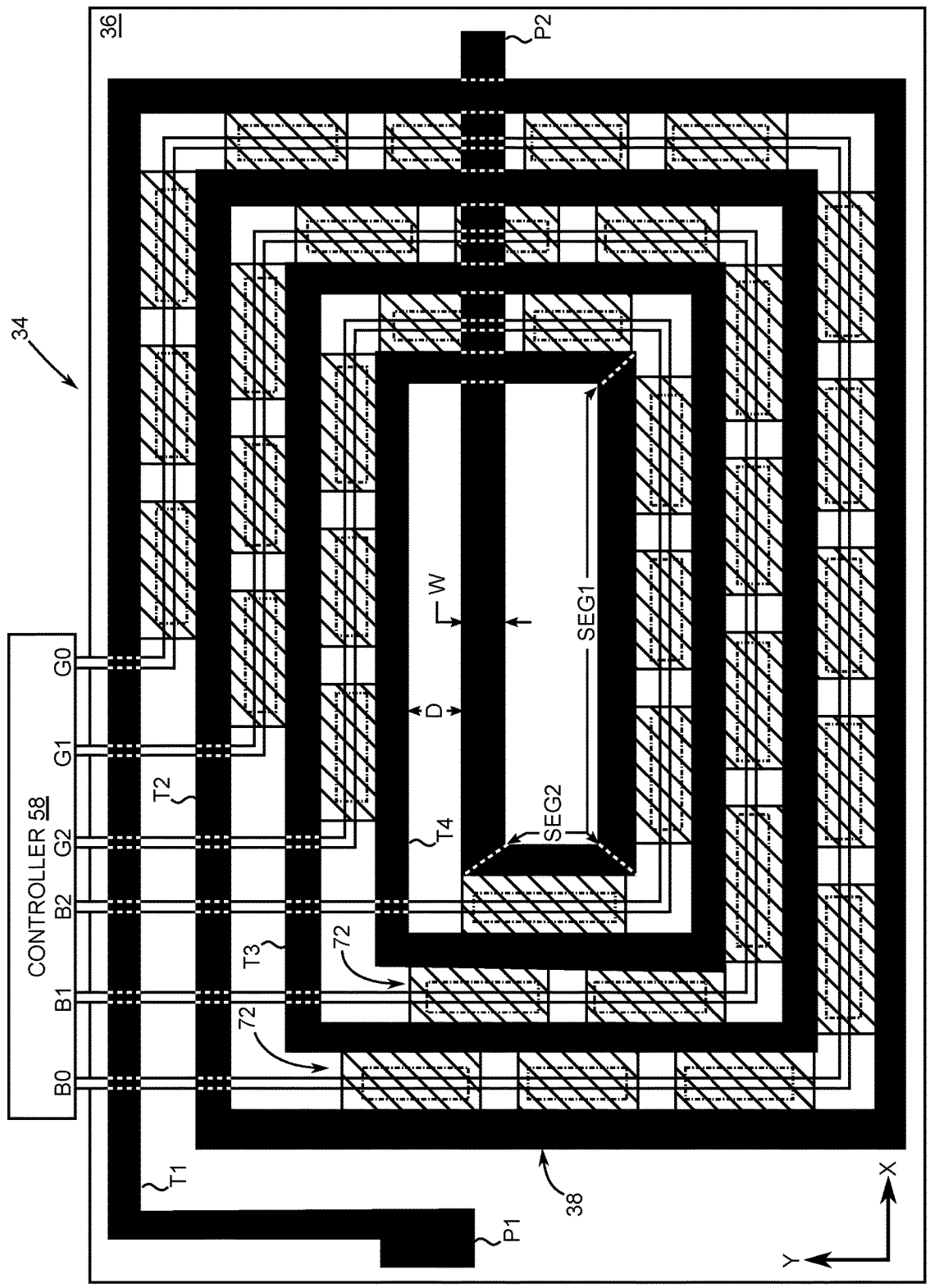
FIG. 5 is a plan view of a third embodiment of the tunable inductor device having reduced thermal coupling between PCSs.

FIG. 5 is a plan view of a third embodiment of the tunable inductor device 34 having reduced thermal coupling between PCSs. The difference between the third embodiment and the second embodiment of FIG. 4 is that the plurality of first PCSs 60 and the plurality of second PCSs 66 is divided into a series of longitudinally spaced-apart PCS segments 72. However, the operation of the third embodiment is practically the same as for the first and second embodiments.

Figure 7:
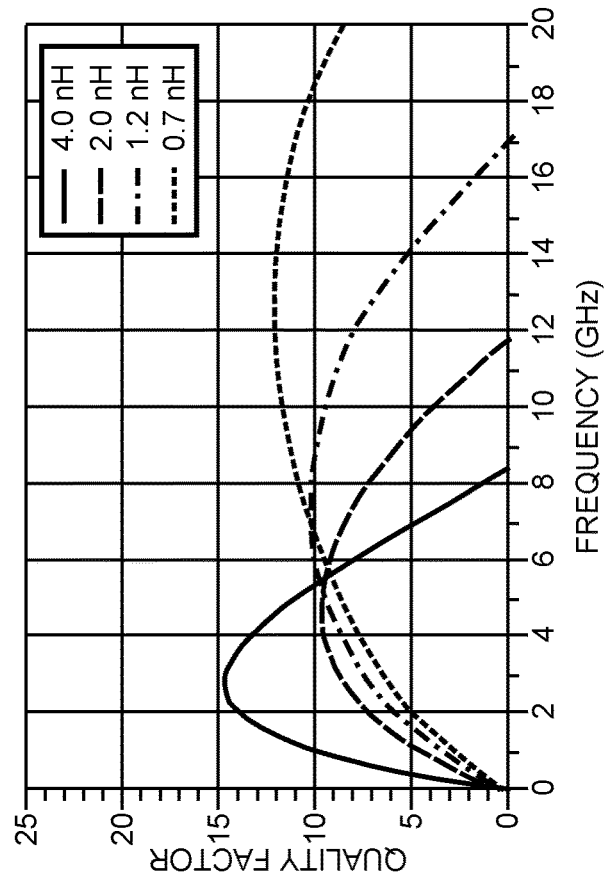
FIG. 7 is a graph of quality factor (Q-factor) versus frequency at each of the four different inductance state settings of FIG. 6 illustrating practical peak Q-factors >10.
Figure 6:
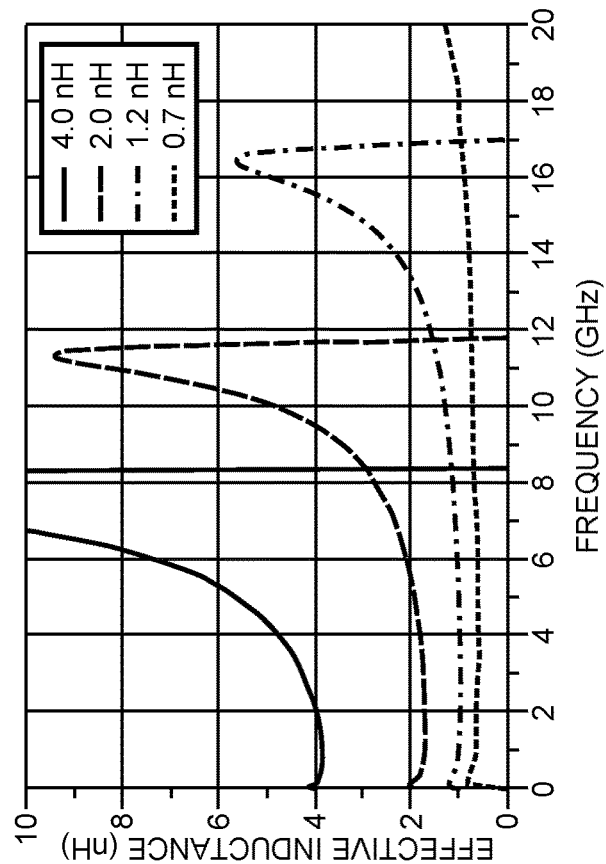
FIG. 6 is a graph of effective inductance provided by the tunable inductor device at four different state settings between 0.7 nanohenries and 4 nanohenries.

FIGS. 6 and 7 are graphs of electromagnetic modelled simulations of the embodiment of the tunable inductor device 34 of FIG. 3. FIG. 6 is a graph of effective inductance provided by the tunable inductor device 34 at four different state settings between 0.7 nanohenries and 4 nanohenries. FIG. 6 also shows the self-resonance frequency (SRF) for each setting. The practical operating frequency is roughly half of this self-resonance frequency for each PCS tuned inductance states. FIG. 7 is a graph of quality factor (Q-factor) versus frequency at each of these four different inductance state settings illustrating practical peak Q-factors>10. These Q-factors are comparable to static passive inductors fabricated in a same process and make up only about 10%-15% of the Q-factor for the lower value inductor states where the Ron resistance of the PCS 10 impacts the loaded Q-factor of the tunable inductor device 34. It should also be observed that the peak Q-factors occur at roughly half of the SRF given in FIG. 6. For an inductance value of about 4 nanohenries, the usable frequency of operation is roughly up to 4 GHz, about half of the 8.3 GHz SRF at this inductance setting. While Q-factor may be increased by increasing the switch periphery of the PCS switch 10 (FIGS. 1 and 2), this does not improve the SRF and practical operating frequency.

It has been determined that the SRF is strongly determined by the substrate parasitic capacitance. An additional feature of this disclosure is to provide suspension of metallization comprising the planar spiral conductor on a supporting material of the suspension layer 18 above an effective lower dielectric material (Er<9) rather than directly on the substrate 36, which may have an Er>9.

Figure 9:
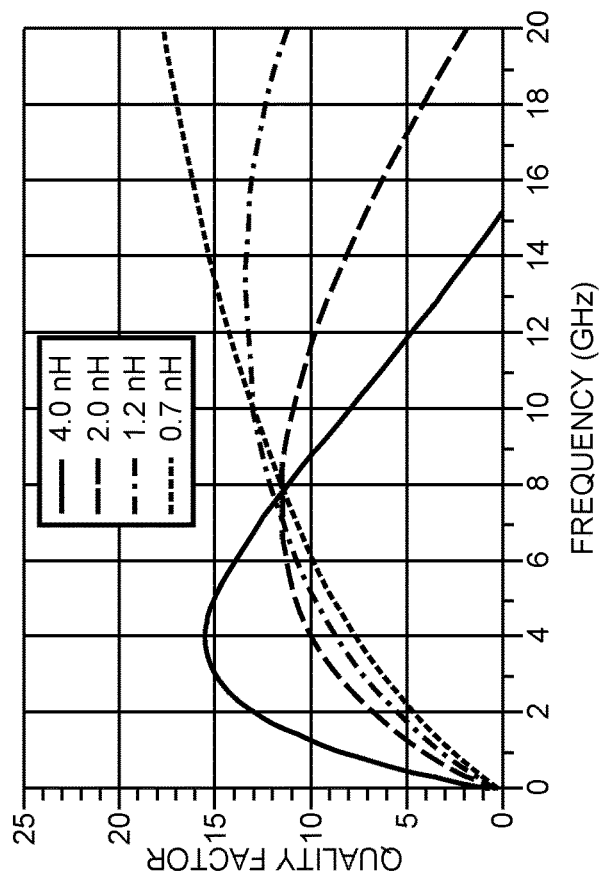
FIG. 9 is a graph of Q-factor versus frequency that provides the Q-factor at each of these four different inductance state settings for the tunable inductor device suspended over an air chamber.
Figure 8:
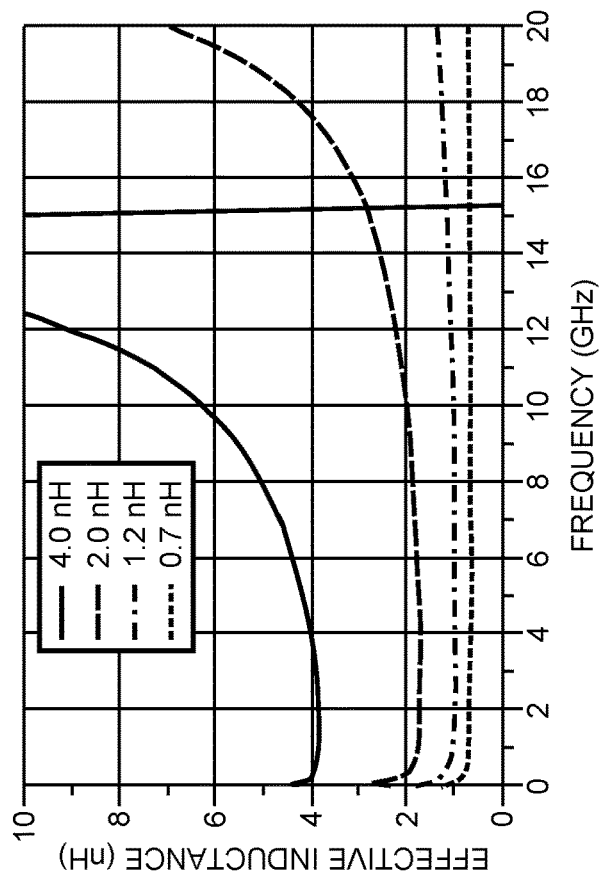
FIG. 8 is a graph of inductance versus frequency illustrating an effective inductance at four different state settings between 0.7 nanohenries and 4 nanohenries for the tunable inductor device suspended over an air chamber.

FIGS. 8 and 9 provide electromagnetic modelled simulations of an air-suspended embodiment of FIG. 3. FIG. 8 is a graph of inductance versus frequency illustrating an effective inductance at four different state settings between 0.7 nanohenries and 4 nanohenries. FIG. 8 demonstrates that the self-resonance frequency (SRF) for each setting is nearly two times higher for the tunable inductor device 34 suspended over an air chamber versus the tunable inductor device when not suspended over an air chamber. This illustrates that monolithic microwave integrated circuit embodiments of the tunable inductor device 34 suspended over an air chamber may be more practical for higher microwave frequency tuned circuits. FIG. 9 is a graph Q-factor versus frequency that provides the Q-factor at each of these four different inductance state settings for the tunable inductor device 34 suspended over an air chamber. The graph of FIG. 9 illustrates higher peak Q-factors as well as broader Q-factor range of operation where Q is >10. In fact for the lowest inductance state of 0.7 nH, the Q-factor and SRF has substantially improved over the unsuspended embodiment of the tunable inductor device 34, achieving a peak Q-factor >17 at >20 GHz of operation.

Figure 11:
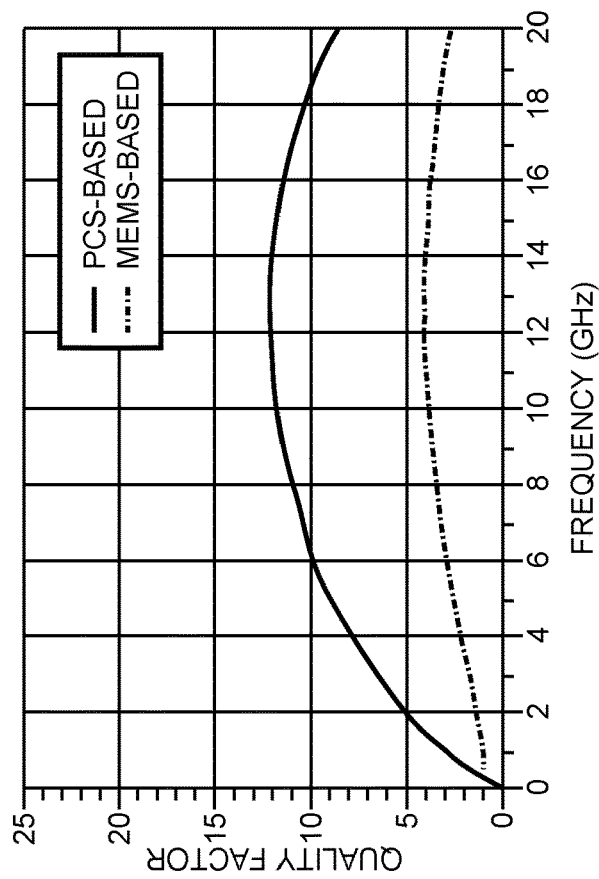
FIG. 11 is a graph of Q-factor versus frequency illustrating that under the same size constraints, the tunable inductor device substantially outperforms a microelectromechanical systems implementation regarding Q-factor.
Figure 10:
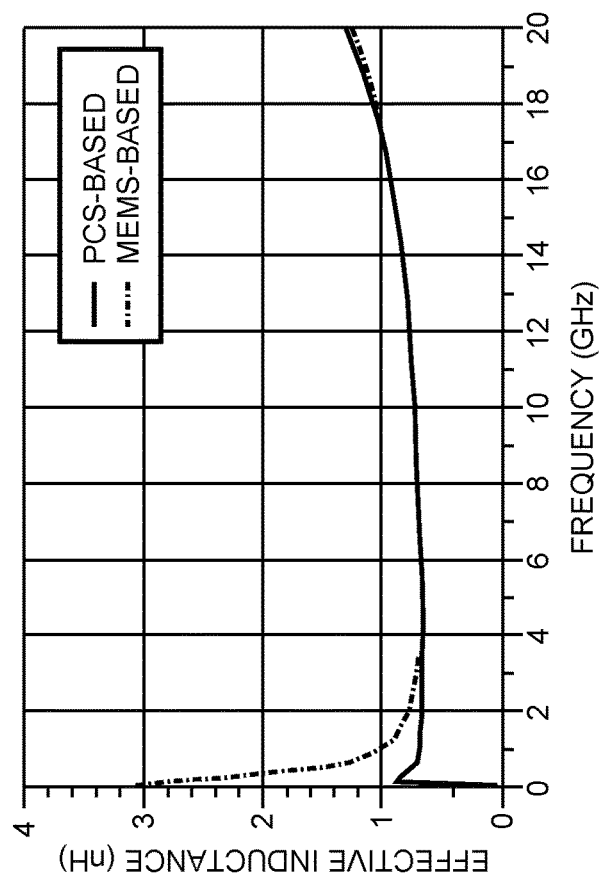
FIG. 10 is a graph of effective inductance versus frequency comparing performance of the tunable inductor device of the present disclosure with a microelectromechanical systems tunable inductor.

FIGS. 10 and 11 are graphs that show results of an electromagnetic simulated comparison of the tunable inductor device 34 depicted in FIG. 3 versus a microelectromechanical systems (MEMS) technologies tunable inductor device. A lowest inductive state, which produces the lowest Q-factor of the tuning range, is used in this comparison. FIG. 10 is a graph of effective inductance versus frequency comparing performance of the tunable inductor device 34 to a MEMS-based tunable inductor. The graph of FIG. 10 illustrates that effective inductance provided by the tunable inductor device 34 tracks the effective inductance of the MEMS-based tunable inductor between 3 GHz and 18 GHz. FIG. 11 illustrates that under the same size constraints, the tunable inductor device 34 substantially outperforms the MEMS implementation regarding Q-factor.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A tunable inductor device comprising:
   a substrate;
   a planar spiral conductor having a plurality of spaced-apart turns disposed over the substrate, wherein each of the plurality of spaced-apart turns has first segments that are longitudinally aligned in a first direction and second segments that are longitudinally aligned in a second direction that is different from the first direction; and
   at least one first segment phase change switch (PCS) comprising:

a first patch of a phase change material (PCM) disposed over the substrate between and in contact with a pair of adjacent first segments, wherein the patch of the PCM is electrically insulating in an amorphous state and electrically conductive in a crystalline state; and a first thermal element disposed adjacent to the first patch of the PCM, wherein the first thermal element is configured to maintain the first patch of the PCM to within a first temperature range until the first patch of the PCM converts to the amorphous state when electrical current within a first current range is flowing through the first thermal element and maintain the first patch of the PCM within a second temperature range until the first patch of the PCM converts to the crystalline state when electrical current is flowing through the thermal element within a second current range.

2. The tunable inductor device of claim 1 wherein the first thermal element is configured to couple to one or more outputs of a controller, wherein electrical current flows through the first thermal element within the first current range for a first duration when the controller generates a first output voltage range at the one or more outputs for the first duration and electrical current flows through first thermal element within the second current range for a second duration when the controller generates a second output voltage range at the one or more outputs for the second duration.

3. The tunable inductor device of claim 1 wherein the first current range is between 200 milliamperes and 500 milliamperes and the second current range is between 700 milliamperes and 1000 milliamperes.

4. The tunable device of claim 1 wherein the patch of the PCM is vanadium dioxide (VO$_2$).

5. The tunable inductor device of claim 1 wherein the patch of the PCM is germanium telluride (GeTe).

6. The tunable inductor device of claim 1 wherein the at least one PCS has an on-state resistance that is between 0.1Ω and 1.0Ω.

7. The tunable inductor device of claim 1 wherein the at least one PCS has an off-state resistance that is between 1000Ω and 1,000,000Ω.

8. The tunable inductor device of claim 1 wherein the at least one PCS has an off-state capacitance between 0.5 picofarads and 0.001 picofarads.

9. The tunable inductor device of claim 1 wherein the first temperature range is between 500° C. and 800° C.

10. The tunable inductor device of claim 9 wherein the second temperature range is between 100° C. and 300° C.

11. The tunable inductor device of claim 1 wherein the substrate comprises silicon carbide.

12. The tunable inductor device of claim 1 wherein individual lengths of the plurality of first segment PCSs are between 30% and 50% of the length of the shortest one of the adjacent segments that each individual PCS of the plurality of first segment PCSs is disposed between.

13. The tunable inductor device of claim 1 wherein individual lengths of the plurality of first segment PCSs are between 50% and 100% of the length of the shortest one of the adjacent segments that each individual PCS of the plurality of first segment PCSs is disposed between.

14. The tunable inductor device of claim 1 further comprising:

at least one second segment PCS comprising:

a second patch of PCM disposed over the substrate between and in contact with a pair of adjacent second segments, wherein the second patch of the PCM is electrically insulating in an amorphous state and electrically conductive in a crystalline state; and a second thermal element disposed adjacent to the second patch of the PCM, wherein the second thermal element is configured to maintain the second patch of the PCM to within the first temperature range until the second patch of the PCM converts to the amorphous state when electrical current within the first current range is flowing through the second thermal element and maintain the second patch of the PCM within the second temperature range until the second patch of the PCM converts to the crystalline state when electrical current is flowing through the first thermal element within the second current range.

15. The tunable inductor device of claim 14 wherein the second direction is orthogonal to the first direction within ±5 degrees.

16. The tunable inductor device of claim 14 wherein the second thermal element is configured to couple to one or more outputs of a controller, wherein electrical current flows through the second thermal element within the first current range for a first duration when the controller generates the first output voltage range at the one or more outputs for the first duration and electrical current flows through second thermal element within the second current range for a second duration when the controller generates the second output voltage range at the one or more outputs for the second duration.

17. The tunable inductor device of claim 14 wherein individual lengths of the plurality of second segment PCSs are between 30% and 50% of the length of the shortest one of the adjacent segments that each individual PCS of the plurality of first segment PCSs is disposed between.

18. The tunable inductor device of claim 14 wherein individual lengths of the plurality of second segment PCSs are between 50% and 100% of the length of the shortest one of the adjacent segments that each individual PCS of the plurality of first segment PCSs is disposed between.

19. The tunable inductor device of claim 14 wherein the plurality of first segment PCSs and the plurality of second segment PCSs are divided into spaced apart segments.

20. The tunable inductor device of claim 1 wherein the planar spiral conductor is integrated into a monolithic microwave integrated circuit.

* * * * *